United States Patent [19]

Inoue

[11] Patent Number: 4,517,026
[45] Date of Patent: May 14, 1985

[54] METHOD OF BACKSIDE HEATING A SEMICONDUCTOR SUBSTRATE IN AN EVACUATED CHAMBER BY DIRECTED MICROWAVES FOR VACUUM TREATING AND HEATING A SEMICONDUCTOR SUBSTRATE

[75] Inventor: Minoru Inoue, Yokohama, Japan

[73] Assignee: Fujitsu Limited, Kawasaki, Japan

[21] Appl. No.: 483,131

[22] Filed: Apr. 8, 1983

[30] Foreign Application Priority Data

Apr. 9, 1982 [JP] Japan ................. 57-059895

[51] Int. Cl.³ ..................... H01L 21/263; H05B 9/03; H05B 9/80
[52] U.S. Cl. .................... 148/1.5; 29/576 B; 29/576 T; 148/187; 219/10.55 A; 219/10.55 M; 219/10.55 R; 357/91; 427/45.1; 427/53.1
[58] Field of Search ................... 148/1.5, 187; 357/91; 427/53.1, 45.1; 29/576 B, 576 T; 219/10.50 M, 10.55 A, 10.55 R

[56] References Cited

U.S. PATENT DOCUMENTS

| 4,140,887 | 2/1979 | Sutton et al. ........... 219/10.55 M |
| 4,269,581 | 5/1981 | Ury et al. ............... 219/10.55 F |
| 4,273,950 | 6/1981 | Chitre .......................... 427/45.1 |
| 4,303,455 | 12/1981 | Splinter et al. ............... 148/1.5 |
| 4,314,128 | 2/1982 | Chitre ..................... 219/10.55 B |
| 4,339,295 | 7/1982 | Boretos et al. ................ 427/45.1 |
| 4,339,648 | 7/1982 | Jean ......................... 219/10.55 A |
| 4,351,998 | 9/1982 | Keppel ..................... 219/10.55 R |
| 4,412,388 | 11/1983 | Takagi et al. ............ 219/10.55 R |
| 4,419,379 | 12/1983 | Kaplan ........................ 427/45.1 |

FOREIGN PATENT DOCUMENTS

| 0029179 | 11/1979 | European Pat. Off. . |
| 2715665 | 4/1977 | Fed. Rep. of Germany . |
| 2856654 | 1/1978 | Fed. Rep. of Germany . |
| 2705444 | 10/1978 | Fed. Rep. of Germany ..... 427/45.1 |
| 2114105 | 11/1970 | France . |
| 2335043 | 12/1975 | France . |
| 2458323 | 2/1981 | France ........................ 427/45.1 |
| 33272 | 3/1978 | Japan ........................... 427/45.1 |
| 2013459 | 8/1979 | United Kingdom . |

Primary Examiner—Upendra Roy
Attorney, Agent, or Firm—Staas & Halsey

[57] ABSTRACT

A semiconductor substrate arranged in a vacuum treating chamber is heated by using microwaves. The chamber is provided with a window plate pervious to microwaves, and the substrate is mounted on the window plate. A microwave generator is arranged outside of the chamber. The radiated microwaves are guided to the window plate, penetrate it, and are absorbed by the semiconductor substrate, so that the substrate is directly heated to a predetermined temperature in a short time. Since no microwaves leak through the substrate, no parts in the chamber are heated.

2 Claims, 2 Drawing Figures

METHOD OF BACKSIDE HEATING A SEMICONDUCTOR SUBSTRATE IN AN EVACUATED CHAMBER BY DIRECTED MICROWAVES FOR VACUUM TREATING AND HEATING A SEMICONDUCTOR SUBSTRATE

BACKGROUND OF THE INVENTION

1. Field of the Invention

The present invention relates to the production of semiconductor devices, and more particularly, to a method and an apparatus for vacuum treating and heating a semiconductor substrate. The present invention can be suitably applied to form a thin layer of a conductor, insulator or semiconductor on a semiconductor substrate.

2. Description of the Prior Art

Aluminum (Al) has been generally used as a material for electrodes and conductor lines of semiconductor devices. The aluminum is deposited on a semiconductor substrate, usually by a vacuum evaporation method to form a thin aluminum layer.

Recently, in addition to aluminum, aluminum alloys (e.g., Al-Si, Al-Si-Cu), refractory metals (e.g., tungsten, molybdenum) and silicides of the refractory metals have come into use for the electrodes and conductor lines. The formation of a thin layer of the metals and silicides has primarily been effected by a sputtering method, since the vacuum evaporation method is unsuitable for refractory metals and cannot easily control an alloy composition of the formed thin layer.

When the sputtering method is used to deposit one of the above materials on a semiconductor substrate to form a thin layer, the substrate is heated at an elevated temperature to prevent the electrodes and conductor lines from disconnecting at the shoulder portions of the uneven surface of the substrate, decrease the resistivity, prevent electromigration, provide a smooth surface, and increase the grain size.

In order to increase the substrate temperature in a conventional magnetron sputtering apparatus, a heater, e.g., at least one infrared lamp is placed in a vacuum treating chamber. In the case of a planetary type magnetron sputtering apparatus for batch treatment, the holder supporting the semiconductor substrates is rotated and heated up. Therefore, the size of the planetary type holder must be made much larger along with the diameter of the substrates. In practice, it is not always easy to make a heating system to increase the substrate temperature sufficiently. Even if such a heating system can be made, the heater will heat other portions of the apparatus requiring no heating, resulting in outgassing from these parts and poor operation of moving parts. In another type of magnetron sputtering apparatus, the sputtering treatment is carried out in an in-line system. In this case, the apparatus can be made smaller. However, it is difficult to satisfactorily heat the semiconductor substrates in a short time in the vacuum treating chamber. Accordingly, the substrates have to be preheated. Even in this type of apparatus, it is not easy to heat the substrates in the vacuum treating chamber. In practice, the substrates are only heated to an unsatisfactory degree.

SUMMARY OF THE INVENTION

An object of the present invention is to provide a method and an apparatus for treating and heating a semiconductor substrate without providing a heater in a vacuum treating chamber.

Another object of the present invention is to efficiently heat the semiconductor substrate only by a simple heating system.

According to the present invention, a semiconductor substrate is microwave-heated in a vacuum treating chamber by providing a window pervious to microwaves in a shell of the chamber, arranging the substrate so as to cover the window, and placing a microwave generator outside of the chamber to irradiate the substrate with microwaves through the window.

The term "microwaves" is meant electromagnetic waves having a wavelength of 0.1 mm to 1 m.

It is preferable that the window pervious to microwaves be a plate made of quartz, glass or ceramic.

In order to guide the microwaves, a waveguide is arranged between the microwave generator and the window.

BRIEF DESCRIPTION OF THE DRAWINGS

The present invention will become more apparent from the description of the preferred embodiments set forth below with reference to the accompanying drawings, in which.

DESCRIPTION OF THE PREFERRED EMBODIMENTS

Figure 1:
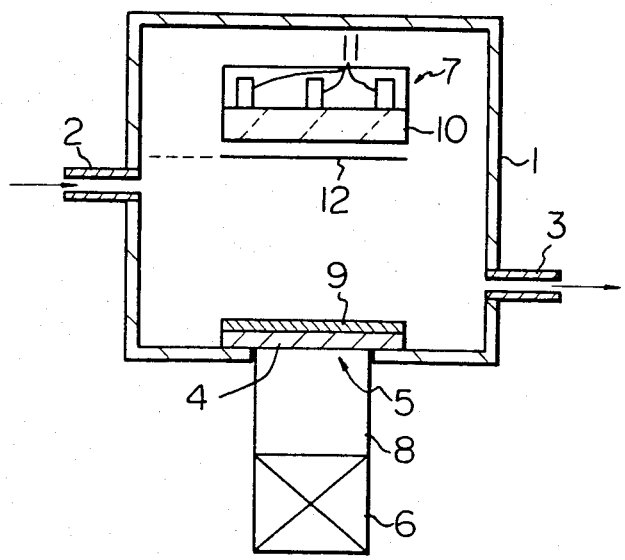
FIG. 1 is a schematic sectional view of a magnetron sputtering apparatus provided with a microwave generator according to the present invention.

Referring to FIG. 1, there is shown a magnetron sputtering apparatus for formation of a thin layer on a semiconductor substrate as an apparatus for treating and heating a semiconductor substrate according to the present invention. The apparatus comprises a vacuum treating chamber 1 with a gas inlet pipe 2 and an exhaust pipe 3, a plate 4 which covers air-tightly an opening 5 in the shell of the chamber 1, a microwave generator 6, and a conventional magnetron sputtering gun unit 7. The exhaust pipe 3 is connected to a vacuum pump (not shown). The microwave generator 6 is provided with a waveguide 8 for guiding microwaves to the substrate 9.

On the plate 4 a semiconductor substrate 9 is arranged with the surface to be covered with a thin layer exposed to the inside space of the chamber 1. Since the plate 4 is used as a window pervious to microwaves, the plate 4 must be made of a material pervious to microwaves, such as quartz, glass and ceramic (e.g., $Al_2O_3$, $ZrO_2$, $3Al_2O_3.2SiO_2$, $MgO.Al_2O_3$ and the like). The plate 4 should withstand an elevated temperature at which the substrate is heated. Furthermore, the size of the plate 4 should be the same as or slightly smaller than that of the substrate 9. The radiated microwaves penetrate the plate 4 and are absorbed by the substrate 9 to heat it up. The magnetron sputtering gun unit 7 comprises a target 10 made of, e.g., tungsten, a magnet 11, an electric power source (not shown), and a shutter 12.

A method for forming a thin layer, e.g., a tungsten film, on a semiconductor substrate by using the above-mentioned magnetron sputtering apparatus is explained hereinafter.

First, the silicon substrate 9 is mounted on the quartz plate 4. Argon gas is fed into the vacuum treating chamber 1 through the inlet pipe 2. At the same time the chamber 1 is evacuated through the exhaust pipe 3 to maintain the inside pressure at a constant level of from $10^{-2}$ to $10^{-3}$ Torr.

Then, the microwave generator 6 is operated to radiate microwaves. The microwaves are guided by the waveguide 8 to reach the substrate 9 through the plate 4. The silicon substrate 9 absorbs the microwave power, thus being heated up to a temperature of, e.g., approximately 600° C. Parts of the apparatus which are made of metal and grounded e.g., a stainless steel shell of the chamber 1 do not absorb microwaves. Thus these parts are not heated, even if irradiated with the microwaves.

Figure 2:
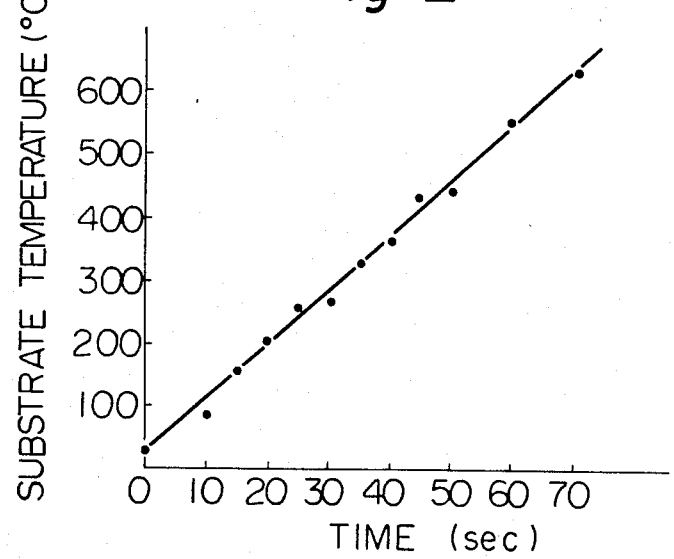
FIG. 2 is a graph showing the relationship between the temperature of a semiconductor substrate and the microwave application time.

If microwaves having a frequency of 2.45 GHz (wavelength: approximately 12 cm) and a power of 500 W are applied to a silicon substrate 9 having a thickness of approximately 0.6 mm, the temperature of the substrate is increased as shown in FIG. 2. In this case, the silicon substrate 9 can be heated up to approximately 600° C. in a very short time of approximately 70 seconds.

Then, a negative high voltage is applied to the target 10 of tungsten, so that the tungsten of the target 10 is sputtered by argon ion bombardment. When the shutter 12 is opened, the sputtered tungsten is deposited on the surface of the silicon substrate 9 to form a thin tungsten layer.

When a thin tungsten layer having the predetermined thickness is obtained, the shutter 12 is closed. The application of the negative voltage to the target 10 is then stopped, and the operation of the microwave generator 6 is stopped. After the vacuum condition is cancelled, the silicon substrate 9 covered with the thin tungsten layer, is removed from the chamber 1.

In accordance with a conventional process for producing a semiconductor device, the thin tungsten layer is selectively removed by a photoetching method to form a pattern of electrodes and conductor lines.

According to the microwave heating method of the present invention, the microwaves penetrating the plate 4 can be entirely absorbed by the semiconductor substrate 9. Therefore, just the substrate 9 can be directly heated with a good efficiency to a predetermined temperature in a short time. The heating rate can be precisely controlled. Accordingly, the heating operation becomes easy, and the heating time is remarkably reduced, as compared with a conventional heating means. Furthermore, since no microwaves leak out of the semiconductor substrate 9 into the vacuum treating chamber 1, i.e., the substrate 9 shields the inside space from microwaves, no other parts are heated and the generation of plasma is prevented. Without the positioning of the substrate on the plate, the microwaves might aid the generation of plasma.

Since a microwave heating method is used as the heating means, it is unnecessary to locate a heater within the vacuum treating chamber. Furthermore, the microwaves can be guided by a waveguide even from a relatively long distance. Accordingly, the apparatus can be easily designed, leading to remarkable miniaturization and simplification of the apparatus.

It is possible to form a thin layer made of not only a single metal such as tungsten, but also alloys, silicides and the like in the above-mentioned magnetron sputtering apparatus.

For example, a thin aluminum-silicon (Al-Si) layer having a grain size of approximately 1 to 2 $\mu$m can be formed on a silicon substrate in the apparatus illustrated in FIG. 1. In this case, the target 10 of the magnetron sputtering unit is made of an Al-Si (10 wt%) alloy. The inside pressure of the vacuum treating chamber, i.e., the pressure of the argon gas atmosphere, is maintained at approximately $10^{-3}$ Torr. The substrate is heated to approximately 300° C. by means of the microwave heating. The Al-Si target is sputtered by argon ions to deposit sputtered Al-Si on the substrate, so as to form the thin layer.

With a conventional sputtering apparatus and method, the resultant thin Al-Si layer would have a grain size of from 0.2 to 0.5 $\mu$m, because the semiconductor substrate could not be satisfactorily heated.

Furthermore, a thin tantalum silicide (TaSi$_2$) layer having a resistivity of from about 13 to 16 $\mu\Omega$-cm can be formed on a silicon substrate in the above-mentioned apparatus. In this case, the target is made of TaSi$_2$. An argon gas atmosphere having a pressure of approximately $10^{-3}$ Torr is formed within the vacuum treating chamber. The substrate is heated to approximately 600° C. by means of the microwave heating. The TaSi$_2$ target is sputtered by argon ions to deposit sputtered TaSi$_2$ on the substrate so as to form the thin layer.

With a conventional sputtering apparatus and method, the resultant thin TaSi$_2$ layer would have a resistivity of from about 25 to 30 $\mu\Omega$-cm.

The present invention is also applicable to a chemical vapor deposition (CVD) method. For example, a silicon dioxide (SiO$_2$) layer can be formed on a silicon substrate by using the above-mentioned apparatus without the sputtering unit. In this case, a mixed gas atmosphere having a pressure of from 1.3 to 2.0 Torr is formed within the vacuum treating chamber. The mixed gas consists of a silane (SiH$_4$) gas diluted with an argon gas (concentration of SiH$_4$: approximately 1%) and a nitric oxide (NO) gas. The substrate is heated to a temperature of from 750° to 850° C. by means of microwaves as mentioned hereinbefore. Thus, the SiO$_2$ layer is grown on the substrate in accordance with the CVD process. The breakdown voltage of the formed SiO$_2$ layer becomes higher as the substrate temperature becomes higher. For example, the breakdown voltages of a SiO$_2$ layer formed at substrate temperatures of about 750° C. and about 850° C. are approximately 7.5 MV/cm and 8 to 9 MV/cm, respectively.

The present invention is also applicable to an epitaxial growth method. For example, a single crystalline silicon layer can be epitaxially grown on a silicon substrate by using the above-mentioned apparatus without the sputtering unit. In this case, a mixed gas atmosphere having a pressure of from 0.1 to 10 Torr is formed within the vacuum treating chamber. The mixed gas consists of a SiH$_4$ gas diluted with a hydrogen gas (concentration of SiH$_4$: approximately 1%) and a hydrogen gas. The substrate is heated to a temperature of approximately 1050° C. by means of microwaves as mentioned hereinbefore. Thus, the silicon single crystalline layer is formed in accordance with the epitaxial process. The dislocation density of the thus obtained silicon epitaxial layer is equal to or less than that of the silicon substrate, and may be substantially zero. In the case where the formed silicon epitaxial layer has the N conductivity type, a resistivity of approximately 1 $\Omega$-cm and a thickness of approximately 5 $\mu$m, the carrier life is from 0.5 to 1 msec.

It will be obvious that the present invention is not restricted to the above-described embodiments, and that many variations are possible for persons with ordinary skill in the art without departing from the scope of the present invention. For example, the present invention is applicable to a vacuum evaporation method in addition to the above-mentioned sputtering method, CVD method and epitaxial method. It is possible to form a thin layer for electrodes made of refractory metals such as molybdenum and titanium, silicides of the refractory metals, and alloys such as Al-Si-Cu and Al-Si, and to form a thin insulating layer made of insulator such as silicon nitride ($Si_3N_4$) and silicon oxynitride ($SiO_xN_y$), in addition to the above-described materials. Furthermore, the present invention can be applied not only to a batch system but also to an in-line system. The plate which is pervious to microwaves, may be arranged at the side or the top of the vacuum treating chamber shell, instead of at the bottom thereof.

I claim:

1. A method of heating a semiconductor substrate, having a back and a surface to be treated, under a reduced pressure within a vacuum treating chamber having a window which is pervious to microwaves, comprising the steps of:
   (a) arranging the semiconductor substrate so as to expose the surface to be treated to the inside space of the vacuum treating chamber and to cover the window pervious to microwaves with the back of the semiconductor substrate; and
   (b) irradiating the semiconductor substrate with microwaves through the window pervious to microwaves so that the microwaves heat only the substrate.
2. A method according to claim 1, wherein the window pervious to microwaves is a plate made of a material selected from the group consisting of quartz, glass and ceramic.

* * * * *